United States Patent [19]

Shimada et al.

[11] Patent Number: 5,814,882
[45] Date of Patent: Sep. 29, 1998

[54] SEAL STRUCTURE FOR TAPE CARRIER PACKAGE

[75] Inventors: Yuzo Shimada; Koetsu Tamura, both of Tokyo, Japan

[73] Assignee: NEC Corporation, Tokyo, Japan

[21] Appl. No.: 498,797

[22] Filed: Jul. 6, 1995

[30] Foreign Application Priority Data

Jul. 20, 1994 [JP] Japan .................................. 6-167620

[51] Int. Cl.$^6$ .......................... H01L 23/12; H01L 23/495; H01L 23/28; H01L 23/52
[52] U.S. Cl. .......................... 257/704; 257/668; 257/687; 257/778; 257/787
[58] Field of Search .................................. 257/668, 684, 257/704, 706, 707, 687, 675, 787, 778

[56] References Cited

U.S. PATENT DOCUMENTS

| 4,649,418 | 3/1987 | Uden | 257/687 |
|---|---|---|---|
| 5,016,084 | 5/1991 | Nakao | 257/704 |
| 5,083,191 | 1/1992 | Ueda | 257/783 |
| 5,357,400 | 10/1994 | Takekawa | 361/704 |
| 5,390,079 | 2/1995 | Aomori et al. | 361/749 |
| 5,404,273 | 4/1995 | Akagawa | 361/707 |
| 5,442,232 | 8/1995 | Goto et al. | 257/668 |

FOREIGN PATENT DOCUMENTS

| 508266 | 10/1992 | European Pat. Off. | 257/704 |
|---|---|---|---|
| 3-805130 | 9/1988 | Germany | 257/704 |
| 59-195850 | 11/1984 | Japan | 257/684 |
| 60-89945 | 5/1985 | Japan | 257/684 |
| 1-215050 | 8/1989 | Japan | 257/704 |
| 4-11758 | 1/1992 | Japan | 257/707 |
| 4-267545 | 9/1992 | Japan | 257/684 |

Primary Examiner—Teresa M. Arroyo
Attorney, Agent, or Firm—Whitham, Curtis & Whitham

[57] ABSTRACT

An organic insulation film has inner leads electrically connecting a conductor thereof with an LSI chip. The inner leads are connected to pads on the periphery of the LSI chip. The connecting portions between the inner leads and the pads of the LSI chip are sealed by casting a plastic seal. The plastic seal extends over the back side of the organic insulative film. The projected portion of the plastic seal at the back side of the organic insulative film is covered with a moisture-proofing seal member to provide more inexpensive than transfer molding and highly reliable seal structure for a tape carrier package.

20 Claims, 2 Drawing Sheets

SEAL STRUCTURE FOR TAPE CARRIER PACKAGE

BACKGROUND OF THE INVENTION

1. Field of the Invention

The present invention relates generally to a seal structure for a tape carrier package. More specifically, the invention relates to a seal structure of a tape carrier package employing a plastic seal.

2. Description of the Related Art

Conventionally, in a tape carrier package, inner leads are formed in a predetermined pattern on the surface of an organic film which has electrically insulative property. The inner leads are electrically connected to a circuit pattern on the organic film. Also, on the organic film, outer leads and/or pads and so forth for electrical connection with a packaging substrate are formed.

When an LSI chip is mounted on the tape carrier package, the LSI chip and the inner leads are positioned precisely. Then, the LSI chip is bonded on the inner leads.

After bonding, the LSI chip and the inner leads are sealed by plastic seal through transfer molding or potting. In a method for forming the plastic seal by the transfer molding, a preliminarily prepared molding die is employed. A plastic is injected into the molding die under a pressure.

On the other hand, in a method for forming the plastic seal by potting, the plastic seal is formed by discharging a liquid state plastic through a nozzle for coating the LSI chip and the inner leads.

In the above-mentioned conventional tape carrier package, when the plastic seal is formed for sealing the LSI chip and the inner leads, molding die becomes necessary. In addition, the plastic has to be injected under pressure.

Therefore, in case of the process employing the transfer molding, cost for facility becomes high. Furthermore, by the pressure upon injection of the plastic and casting of the plastic, mechanical stress is exerted on the bonding portion of the inner leads or the aluminum conductor portion of the LSI chip to possibly cause failure, such as connection failure, disposition of the aluminum conductor and so forth.

On the other hand, in case that the plastic seal is formed by potting, while the facility becomes inexpensive and mechanical stress can be reduced, it becomes quite difficult to uniformly control the thickness of the plastic seal formed over the chip surface of the LSI chip (the bonding portion of the LSI chip to the inner leads) and the back surface of the organic film.

Therefore, upon mounting the tape carrier package on the packaging substrate, a gap between the tape carrier package and the packaging substrate cannot be maintained uniformly to degrade reliability in packaging of the tape carrier package to the packaging substrate.

Also, in either case of formation of plastic seal by the transfer molding or potting, since seal is established by an organic plastic, it has poor moisture-proof property.

Namely, when moisture is absorbed by the organic region, electrical migration can be caused in the conductor in the LSI chip, or the moisture absorbed within the organic plastic may be expanded due to heat due to soldering or generated by the LSI chip to possibly cause peeling off of the sealing organic plastic. Therefore, reliability can be significantly degraded,

SUMMARY OF THE INVENTION

Therefore, it is an object of the present invention to solve the problems in the prior art as set forth above and to provide a seal structure for a tape carrier package which is less expensive than the transfer molding and has high reliability.

According to the first aspect of the invention, a seal structure for a tape carrier package comprises:

a plastic member sealing mounting portions of an organic insulation film formed with a conductor pattern, inner leads electrically connected to the conductor pattern, a large scale integration circuit chip mounted on the inner leads and electrically connected to the inner leads; and a cap member for covering the plastic member projecting to the back surface of the organic insulation film.

The seal structure may further comprise a heat radiation plate mounted on a surface of the large scale integration circuit chip opposite to the mounting surface, and a framing plate shielding a gap between the heat radiation plate and the surface of the organic insulation film.

According to another aspect of the invention, a sealing method for a tape carrier package comprises the steps of:

providing inner leads electrically connected to a conductor pattern formed on an organic insulation film;

electrically connecting the inner leads and a large scale integrated circuit chip;

providing a cap member on the back side of the organic insulation film;

positioning the cap member so that the cap member may be seen through gaps formed between adjacent inner leads;

covering connecting portions between the inner leads and the large scale integration circuit chip by casting a plastic member into the cap member.

According to a further aspect of the invention, a sealing method for a tape carrier package comprises the steps of:

providing inner leads electrically connected to a conductor pattern formed on an organic insulation film;

electrically connecting the inner leads and a large scale integrated circuit chip;

providing a cap member on the back side of the organic insulation film;

filing molten plastic member in the cap member;

pressing the large scale integration circuit chip to the cap member and covering connecting portions between the inner leads and the large scale integration circuit chip by the plastic member within the cap member.

According to a still further aspect of the invention, a seal structure for a tape carrier package, in which a semiconductor chip element assembled to an insulative film with connecting inner leads thereof with a conductive pattern on the insulative film, the seal structure comprising:

a plastic member sealingly covering connecting portions between the inner leads and the semiconductor chip for establishing electrical connection therebetween; and a hermetic member sealingly covering the plastic sealing member for establishing a moisture-proofing seal around the plastic sealing member.

The plastic sealing member may be formed of a plastic material having an adhesion property, which fixes the hermetic sealing member therearound. On the other hand, the hermetic sealing member may be formed of a moisture-proofing ceramic or metal.

According to a yet further aspect of the invention, a method for establishing a moisture-proof and stress free seal for connecting portions between inner leads connected to a conductor pattern on an insulative film and a large scale integration circuit chip, comprises the steps of:

placing a moisture-proof hermetic sealing member at a first side of the insulative film opposite to a second side where the large scale integration circuit chip is assembled;

aligning the hermetic sealing member with the large scale integration circuit chip; and forming a plastic seal block surrounding the connecting portions, and in conjunction therewith, fixing the hermetic sealing member in a position covering the plastic seal block for establishing a moisture proof seal.

The plastic seal block may be formed by casting a plastic material from the second side of the insulative film so that a part of casted plastic fills the interior space of the hermetic sealing member. In the alternative, the method, the plastic seal block may be formed by preliminarily filling molten plastic material within the interior space of the hermetic sealing member and pressing the large scale integration circuit toward the hermetic sealing member so that a part of molten plastic material is extruded toward the second side of the insulative film for entirely surrounding the connecting portion.

The moisture-proof seal may be established by the hermetic sealing member in cooperation with a heat radiation plate attached to the large scale integration circuit and peripheral wall member surrounding periphery of the plastic seal block between the insulative film and the heat radiation plate.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed in terms of the preferred embodiments, in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

Figure 1:
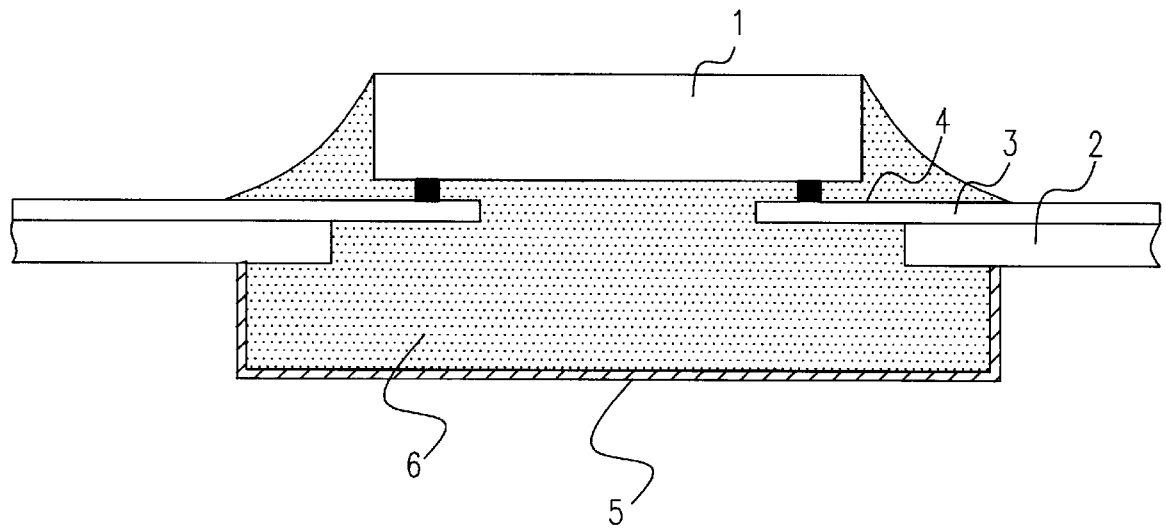
FIG. 1 is a section of the first embodiment of a seal structure for a tape carrier package according to the present invention.

FIG. 1 is a section of the first embodiment of a seal structure for a tape carrier package according to the invention. In FIG. 1, an LSI chip 1 is formed into a square configuration of 17.5 mm×17.5 mm, in which approximately eight hundreds of I/O terminals are formed along the peripheral edge of the chip at a pitch of 80 μm.

On the surface of an organic insulation film 2, a circuit wiring pattern is formed with a conductor 3 (e.g. copper)is formed. The thickness of the conductor is in a range of approximately 10 to 25 μm and the surface thereof is coated by the plating of gold.

On the other hand, the organic insulation film 2 is formed with a through hole (not shown) or, in the alternative, an outer lead at the outer side for establishing electrical connection with the packaging substrate (not shown). In case of the through hole, the circuit conductor pattern on the surface of the organic insulation film is connected to the back side of the organic insulation film 2 via the through hole.

The organic insulation film 2 is further formed with inner leads 4 for electrical connection between conductors 3 and the LSI chip 1. The inner leads 4 are coupled with pads provided at the periphery of the LSI chip 1.

Since gaps are defined between adjacent inner leads 4, respectively, a sealing plastic 6 casted from the surface side of the organic insulation film 2 may project toward the back surface side of the organic insulation film 2.

In the shown embodiment, the sealing plastic 6 projecting toward the back surface of the organic insulation film 2 is covered with a ceramic cap 5. The ceramic cap 5 is firmly fixed to the sealing plastic 6 by bonding ability of the latter.

As the ceramic cap 5, ceramic materials except for porous ceramics (having no moisture proofing property) may be used. Namely, the ceramic cap 5 should have moisture proofing property.

As a method for covering the sealing plastic 6 by means of the ceramic cap 5, at the initial step, the ceramic cap 5 is positioned so that the ceramic cap 2 can be seen through gaps between adjacent inner leads 4. Subsequently, the sealing plastic 6 is casted from the surface side of the organic insulation film 2 to cast into the ceramic cap 5 and thus covers the connecting portions between the inner leads 4 and the pads of the LSI chip 1. In the alternative method, the molten sealing plastic 6 is preliminarily filled in the ceramic cap 5. Then, the ceramic cap 5 filled with the molten sealing plastic 6 is pressed onto the LSI chip 1 from the back side of the organic insulation film 2 so that the connecting portions between the inner leads 4 and the pads of the LSI chip 1 may be covered.

As the sealing plastic 6, epoxy type resin is used. The sealing plastic 6 is casted to establish a structure, in which the connecting portion between the circuit surface of the LSI chip 1 and the inner leads 4 can be completely covered.

With taking the seal structure as set forth above, mechanical stress to be exerted on the bonding portions of the inner leads 4 and the aluminum wiring conductor portion on the LSI chip 1 and so forth upon sealing by the sealing plastic 6, can be reduced. Also, with the shown structure, the seal structure having high moisture-proofing property and reliability can be obtained.

In addition, since the sealing plastic 6 projecting to the back side of the organic film 2 is covered by the ceramic cap 5, a distance from the chip surface of the LSI chip 1 to the ceramic cap 5 can be satisfactorily controlled. Therefore, the gap between the tape carrier package and the packaging substrate can be maintained uniform.

In the shown embodiment, a polyimide film in a thickness of 50 μm is employed as the organic insulation film. The polyimide film has high heat resistivity, dimensional stability and high adhesion with the conductor 3.

While less preferred in view point of heat resistivity, dimensional stability or adhesion with the conductor 3, fluorine type film, epoxy type film and so forth may also applicable as the organic insulation film in the shown embodiment of the seal structure.

Figure 2:
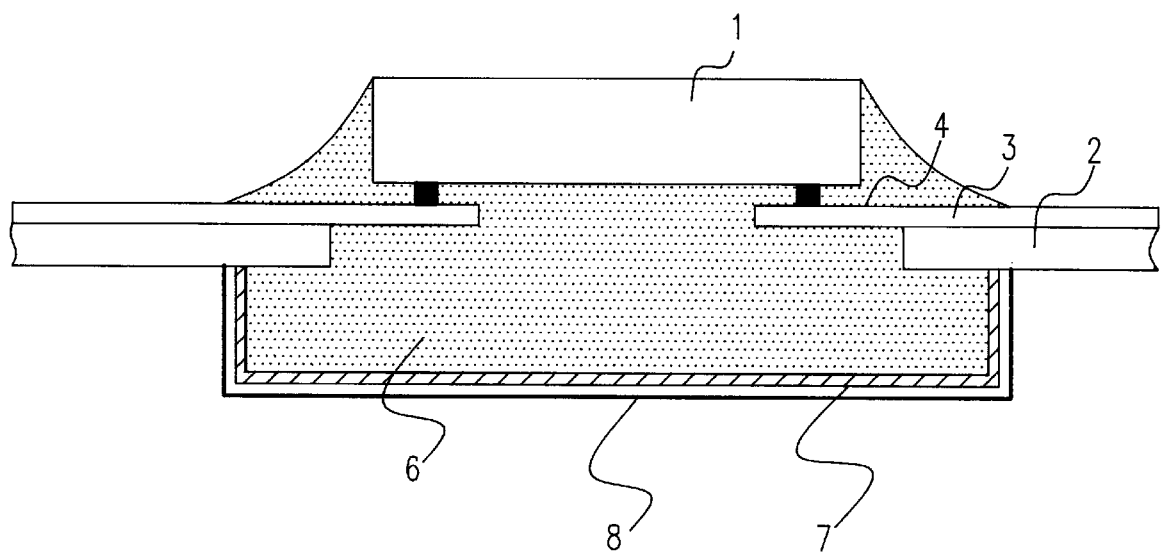
FIG. 2 is a section of the second embodiment of a seal structure for a tape carrier package according to the present invention.

FIG. 2 is a section of the second embodiment of the seal structure for the tape carrier package according to the present invention. In FIG. 2, the shown embodiment of the seal structure employs a metallic cap 7 in place of the ceramic cap 5 employed in the former embodiment. Except for employment of the metallic cap, the shown embodiment has substantially the same structure to the foregoing first embodiment. In the following discussion, like elements to the former embodiment will be represented by the like reference numerals.

As a method for covering the sealing plastic 6 by means of the metallic cap 7, the methods similar to the foregoing first embodiment will be taken. The outer surface of the metallic cap 7 is coated by an insulation layer 8. The metallic cap 7 may establish surface contact with the packaging substrate to fix the tape carrier package on the packaging substrate. By this, reliability of mounting of the tape carrier package on the packaging substrate can be improved.

It should be noted that when the metallic cap 7 does not establish surface contact with the packaging substrate, the metallic cap 7 is not required to be coated by the insulation layer 8. Therefore, the object of the present invention can be achieved by simply covering the sealing plastic 6 with the metallic cap 7 which is not coated by the insulation layer 8.

Figure 3:
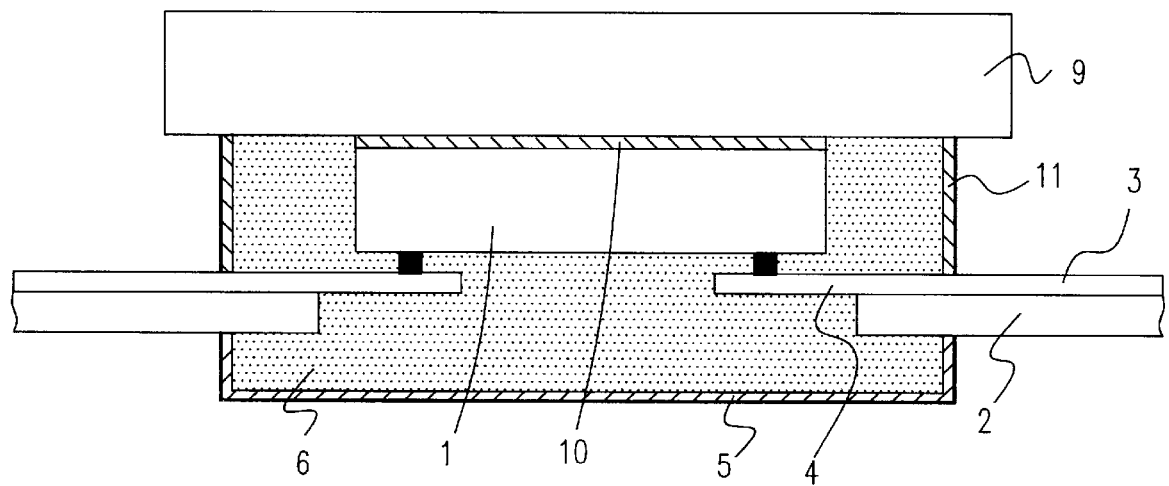
FIG. 3 is a section of the third embodiment of a seal structure for a tape carrier package according to the invention.

FIG. 3 is a section of the third embodiment of the seal structure for the tape carrier package according to the invention. In FIG. 3, the LSI chip 1 is connected to the inner leads 4 through the pads provided at the periphery of the chip and thus electrically connected to the conductor 3 formed on the organic insulation film 2.

On the other hand, on the LSI chip 1, a heat radiation plate 9 is fixed by a bonding layer 10. The preferred material of the heat radiation plate 9 is Cu—W. Cu—W has high heat transfer coefficient of approximately 180 W/mK and thermal expansion coefficient is approximately $6.5 \times 10^{-6}/°C$.

In addition to Cu—W, materials having high heat transfer coefficient, such as metallic materials of Cu—Mo type, Cu-Kovar type, Cu—W—Ni type, Cu type, ceramic material of AlN and so forth, may be used as material of the heat radiation plate 9.

The bonding layer 10 may be formed by uniformly applying Ag epoxy bond on the LSI chip 1. It is advantageous to employ a material of the bond having low thermal resistance. Therefore, in addition to Ag epoxy bond, it is possible to use wax material of Au—Si type or so forth can be used as the material of the bonding layer 10. In such case, heat treatment has to be performed after applying Ti—Au metallization process for the LSI chip and applying Ni plating for the heat radiation plate 9.

In a condition where the heat radiation plate 9 is mounted on the LSI chip 1, a quadrangular ring shaped ceramic framing plate 11 is set between the organic insulation film 2 around the LSI chip 1 and the heat radiation plate 9. Thereafter, the sealing plastic 6 is casted from the back side surface of the organic insulation film 2 so that the bonding portions between the LSI chip 1 and the inner leads 4 can be completely covered.

With covering the sealing plastic 6 projecting from the back surface of the organic insulation film 2 by casting of the sealing plastic 6, the ceramic cap 5 is mounted. The ceramic cap 5 is fixed to the sealing plastic 6 by the bonding force of the latter.

By this, contact between the sealing plastic 6 covering the bonding portion between the LSI chip 1 and the inner leads 4 and atmospheric air is completely shielded by the ceramic cap 5 and the ceramic framing plate 11. Therefore, the sealing structure superior in moisture-proofing property can be obtained to assure quite high reliability.

As the ceramic cap 5 and the ceramic framing plate 11, ceramic materials except for porous ceramics (having no moisture proofing property) may be used. Namely, the ceramic cap 5 and the ceramic framing plate 11 should have moisture proofing property.

Figure 4:
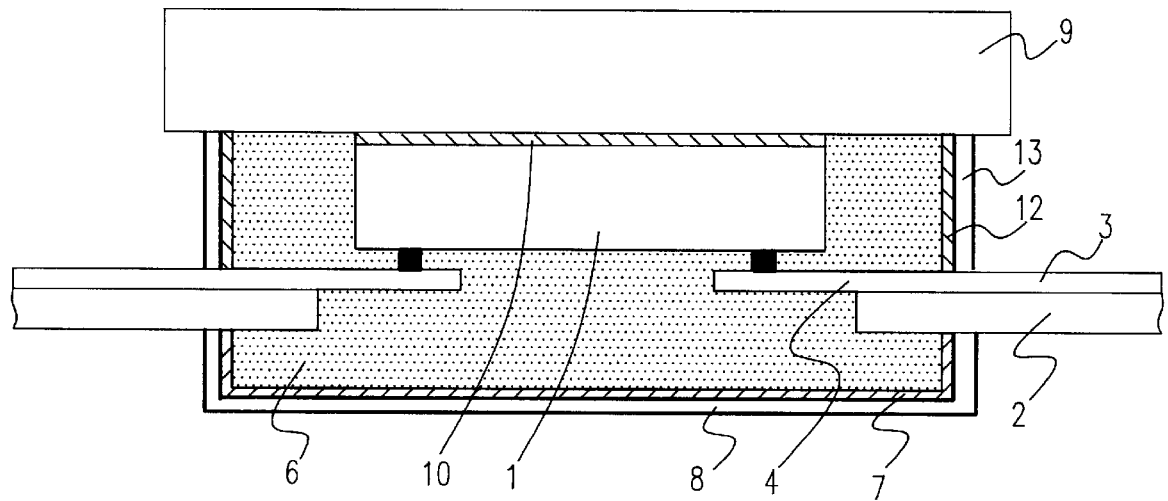
FIG. 4 is a section of the fourth embodiment of a seal structure for a tape carrier package according to the invention.

FIG. 4 is a section of the fourth embodiment of the seal structure for the tape carrier package according to the invention. In FIG. 4, in the embodiment, the seal structure is similar to the third embodiment of the seal structure except for employment of the metallic cap 7 and a metallic framing plate 12 in place of the ceramic cap 5 and the ceramic framing plate 11 as employed in the third embodiment. Like elements to the former embodiment are represented by like reference numerals.

As a method for covering the sealing plastic 6 with the metallic cap 7 and the metallic framing plate 12, similar method as the foregoing embodiment may be taken. On the other hand, the outer surfaces of the metallic cap 7 and the metallic framing plate 12 are coated by insulation layers 8 and 13. By surface contact of the metallic cap 7 on the packaging substrate, the tape carrier package may be fixed on the packaging substrate. By this, reliability in mounting of the tape carrier package on the packaging substrate can be improved.

It should be noted that when the metallic cap 7 does not establish surface contact with the packaging substrate, or insulation of the metallic framing plate 12 is unnecessary, the metallic cap 7 and the metallic framing plate 12 are not required to be coated by the insulation layers 8 and 13.

As set forth above, by shielding contact between the sealing plastic covering the bonding portions between the LSI chip 1 and the inner leads 4 and atmospheric air by means of the ceramic cap 5 and the ceramic framing plate 11 or by means of the metallic cap 7 and the metallic framing plate 12, moisture proofing property which cannot be sufficient solely by the sealing plastic 6, can be remarkably improved.

Namely, when moisture is absorbed by the sealing plastic 6, electrical migration can be caused in the LSI chip 1, or the peeling off of the sealing plastic 6 will be caused.

But, by covering the sealing plastic 6 with the ceramic cap 5 or the metallic cap 7, the electrical migration and the peeling off of the seal can be prevented.

On the other hand, by blocking the gap between the LSI chip 1 and the organic insulation film 2 by the ceramic framing plate 11 or the metallic framing plate 12, the sealing plastic 6 covering the bonding portions between the LSI chip 1 and the inner leads 4 can be covered completely. Therefore, moisture-proofing property can be remarkably improved.

Furthermore, considering mounting of the tape carrier package, when the thickness of the coasting of the sealing plastic 6 is not uniform, reliability in mounting of the tape carrier package on the packaging substrate can be degraded. However, by employing the seal structure according to the present invention, the distance between the chip surface of the LSI chip 1 and the ceramic cap 5 or the metallic cap 7 can be maintained constant. Therefore, the gap between the tape carrier package and the packaging substrate can be maintained constant. Therefore, reliability in mounting can be improved.

Furthermore, in case of the metallic cap 7, with coating the metallic cap 7 by the insulation layer 8, and establishing surface contact between the metallic cap 7 and the packaging substrate, the tape carrier package can be fixed. Thus, reliability in mounting of the tape carrier package on the packaging substrate can be improved.

As set forth above, according to the present invention, by sealing the connecting portions between the inner leads electrically connected to the conductor pattern formed on the surface of the organic insulation film and a large scale integration circuit chip, with the plastic member, and covering the plastic member projecting to the back surface of the organic insulation film by means of the cap member, more inexpensive seal structure than the transfer molding for the tape carrier package with high reliability can be provided.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A seal structure for a tape carrier package comprising:
   an organic insulation film formed with a conductor pattern;
   inner leads electrically connected to said conductor pattern;
   a chip electrically connected to said inner leads to establish a structure wherein a connecting portion between a circuit surface of said chip and said inner leads 15 covered with a plastic member; and
   a cap for covering said plastic member projecting from a back surface of said organic insulation film, wherein said chip sits above said inner leads projecting from a front surface of said organic insulation film.

2. A seal structure for a tape carrier package as set forth in claim 1, which further comprises:
   a heat radiation plate mounted on a top surface of said chip; and
   a framing plate shielding a gap between said heat radiation plate and said organic insulation film.

3. A seal structure for a tape carrier package as set forth in claim 2, wherein said plastic member is filled in a space defined by said cap, said framing plate, and said heat radiation plate.

4. A seal structure for a tape carrier package as set forth in claim 1, wherein said cap comprises a ceramic cap.

5. A seal structure for a tape carrier package as set forth in claim 2, wherein said cap comprises a ceramic cap and said framing plate comprises a ceramic framing plate.

6. A seal structure for a tape carrier package as set forth in claim 3, wherein said cap comprises a ceramic cap and said framing plate comprises a ceramic framing plate.

7. A seal structure for a tape carrier package as set forth in claim 1, wherein said cap member comprises a metallic cap.

8. A seal structure for a tape carrier package as set forth in claim 2, wherein said cap member comprises a metallic cap and said framing plate comprises a metallic framing plate.

9. A seal structure for a tape carrier package as set forth in claim 3, wherein said cap member comprises a metallic cap and said framing plate comprises a metallic framing plate.

10. A seal structure for a tape carrier package as set forth in claim 7, wherein said metallic cap comprises an outer insulation layer.

11. A seal structure for a tape carrier package as set forth in claim 8, wherein said metallic cap comprises a first outer insulation layer, and said metallic framing member comprises a second outer insulation layer.

12. A seal structure for a tape carrier package as set forth in claim 9, wherein said metallic cap comprises a first outer insulation layer, and said metallic framing member comprises a second outer insulation layer.

13. A seal structure for a tape carrier package comprising a semiconductor chip connected with leads to a conductive pattern on an insulating film, said seal structure comprising:
   a plastic sealing member covering connecting portions between said leads and a circuit surface of said semiconductor chip; and
   a hermetic sealing member covering said plastic sealing member for establishing a moisture-proof seal around said plastic sealing member, said hermetic sealing member comprises a cap attached to an underside of said insulating film under said semiconductor chip, wherein a gap between an underside of said semiconductor chip and said cap is filled with said plastic sealing member.

14. A seal structure for a tape carrier package as set forth in claim 12, wherein said plastic sealing member comprises a plastic material having an adhesion property which fixes to said hermetic sealing member.

15. A seal structure for a tape carrier package as set forth in claim 12, wherein said hermetic sealing member comprises a moisture-proof ceramic.

16. A seal structure for a tape carrier package as set forth in claim 12, wherein said hermetic sealing member comprises a metal.

17. A hermetically sealed semiconductor package, comprising:
   an electrically insulating film;
   conductive wiring on said electrically insulating film;
   a semiconductor chip having bonding pads around a periphery of a bottom surface, said semiconductor chip positioned over an opening in said electrically insulating film;
   leads for electrically connecting said bonding pads to said conductive wiring;
   a cap positioned under said electrically insulating film for covering said opening in said electrically insulating film; and
   a hermetic sealing plastic filling said cap to encapsulate said leads, and said bonding pads, and a bottom surface of said semiconductor chip to create a hermetic seal to said semiconductor chip.

18. A hermetically sealed semiconductor package as recited in claim 17 wherein said cap comprises an outer insulating coating.

19. A hermetically sealed semiconductor package as recited in claim 17 further comprising a heat sink mounted to a top surface of said semiconductor chip, wherein said hermetic sealing plastic forms a hermetic seal with said heat sink.

20. A hermetically sealed semiconductor package as recited in claim 17 wherein said cap comprises a ceramic.

* * * * *